United States Patent
Matsui et al.

(10) Patent No.: US 8,710,539 B2
(45) Date of Patent: Apr. 29, 2014

(54) METAL FOIL LAMINATE, SUBSTRATE FOR MOUNTING LED, AND LIGHT SOURCE DEVICE

(75) Inventors: Jun Matsui, Nagahama (JP); Tomohiko Terai, Nagahama (JP); Syuuji Suzuki, Nagahama (JP)

(73) Assignee: Mitsubishi Plastics, Inc., Tokyo (JP)

( * ) Notice: Subject to any disclaimer, the term of this patent is extended or adjusted under 35 U.S.C. 154(b) by 0 days.

(21) Appl. No.: 13/810,112

(22) PCT Filed: Jul. 26, 2011

(86) PCT No.: PCT/JP2011/066917
§ 371 (c)(1),
(2), (4) Date: Jan. 14, 2013

(87) PCT Pub. No.: WO2012/020640
PCT Pub. Date: Feb. 16, 2012

(65) Prior Publication Data
US 2013/0113013 A1 May 9, 2013

(30) Foreign Application Priority Data
Aug. 11, 2010 (JP) .................................. 2010-180129

(51) Int. Cl.
*H01L 33/60* (2010.01)

(52) U.S. Cl.
USPC 257/99; 257/100; 257/E33.057; 257/E33.058

(58) Field of Classification Search
USPC ...................... 257/99, 100, E33.057, E33.058
See application file for complete search history.

(56) References Cited

U.S. PATENT DOCUMENTS

| | | | |
|---|---|---|---|
| 8,169,129 B2* | 5/2012 | Matsui et al. | ................. 313/113 |
| 2008/0057333 A1* | 3/2008 | Chu et al. | ....................... 428/612 |
| 2011/0042124 A1* | 2/2011 | Matsui et al. | ................ 174/157 |
| 2012/0138990 A1* | 6/2012 | Sato et al. | ........................ 257/98 |

FOREIGN PATENT DOCUMENTS

| | | |
|---|---|---|
| JP | 2004 39691 | 2/2004 |
| WO | 2008 023605 | 2/2008 |
| WO | 2009 020169 | 2/2009 |

OTHER PUBLICATIONS

International Search Report Issued Oct. 18, 2011 in PCT/JP11/66917 Filed Jul. 26, 2011.

* cited by examiner

*Primary Examiner* — Minh-Loan T Tran
(74) *Attorney, Agent, or Firm* — Oblon, Spivak, McClelland, Maier & Neustadt, L.L.P.

(57) ABSTRACT

Provided is a metal foil laminate that: has heat resistance; has high reflectance in the visible light range; has little decrease in reflectance in environments with a high-temperature thermal load; is compatible with large surface areas; and can be used for printed circuit boards for mounting LEDs that have excellent adhesion with metals. The metal foil laminate is characterized in that: a laminate has metal foil on at least one side of a resin layer (A) containing a polyorganosiloxane and an inorganic filler; the 90° peel strength between said resin layer (A) and said metal foil is at least 0.95 kN/m, and the mean reflectance at wavelengths of 400 to 800 nm on the surface that is exposed when the resin layer (A) is exposed by peeling and removing said metal foil is at least 80%; and the decrease in the reflectance at a wavelength of 470 nm after being treated with heat for 10 minutes at 260° C. is not more than 5%.

14 Claims, 2 Drawing Sheets

(A)

(B)

(C)

(D)

METAL FOIL LAMINATE, SUBSTRATE FOR MOUNTING LED, AND LIGHT SOURCE DEVICE

CROSS-REFERENCE TO RELATED APPLICATIONS

This application is a National Stage of PCT/JP11/066917 filed Jul. 26, 2011. This application is based upon and claims the benefit of priority to Japanese Application No. 2010-180129 filed Aug. 11, 2010.

TECHNICAL FIELD

The present invention relates to a metal foil laminate having excellent heat resistance and high reflectance characteristics. The present invention relates to a metal foil laminate that can be suitably utilized as, for example, a substrate for mounting LED or the like, and a substrate for mounting LED and a light source device that use this metal foil laminate.

BACKGROUND ART

Chip type LEDs in which elements are directly packaged on a pattern of a printed wiring substrate and are encapsulated with resins, are advantageous for miniaturization and thickness reduction, and therefore, such chip type LEDs are widely used in electronic instruments such as number pad illumination of mobile telephones, and backlights for small-sized liquid crystal displays.

In recent years, the technologies for increasing the luminance of LEDs are in marked progress, and the luminance of LEDs is ever increasing. Along with this progress, the amount of heat emission of the LED elements themselves has increased, and the thermal load exerted on printed wiring substrates is increasing, so that the temperature around the LED elements may rise above 100° C. in some cases. Furthermore, in a process of producing a substrate for mounting LED, a thermosetting treatment of encapsulating resins or employment of lead (Pb)-free solder is carried out, so that the substrates may be exposed to a temperature of about 260° C. to 300° C. in a reflow process. Thus, substrates for mounting LED are more exposed to thermal environments at high temperatures.

In printed wiring substrates formed from thermosetting resin compositions that have been conventionally used, there may be observed a tendency that the degree of whiteness decreases, causing yellowing, and the reflection efficiency is deteriorated, in such an environment under thermal load. Thus, there is still room for improvement in those substrates for mounting next-generation high-luminance LEDs of the future.

On the other hand, ceramic substrates are excellent in terms of heat resistance, but have a rigid and brittle nature. Therefore, there are limitations in attempting to promote size increment and thickness reduction as in the case of resin substrates, and there is a possibility that it may be difficult to deal with ceramic substrates as substrates for general applications for illumination or display applications in the future.

In regard to such problems, for example, the invention described in Patent Document 1 and the like have suggested light reflecting bodies having excellent heat resistance and light resistance, which are formed from a silicone resin or a silicone rubber and an inorganic filler, and have a specular reflectance of 88% or greater.

CITATION LIST

Patent Document

Patent Document 1: WO 2008/23605

DISCLOSURE OF INVENTION

Problem to be Solved by the Invention

In the substrates that are suggested in Patent Document 1 and the like described above, there is a possibility of copper foil being peeled off at the time of etching, plating processing, or repackaging components, and there is room for an improvement.

Thus, it is an object of the present invention to provide a new metal foil laminate that can be suitably used as a printed wiring substrate for LED mounting, which laminate is capable of coping with size increment and thickness reduction, has a high reflectance in the visible light region, has a low decrease in the reflectance in a high temperature environment under thermal load, and has no peeling occurring at the time of etching, plating processing, or repackaging components.

Means for Solving Problem

The present invention proposes a metal foil laminate which includes a resin layer (A) containing a polyorganosiloxane and an inorganic filler, and a metal foil (B) that is laminated on at least one surface of the resin layer (A), in which the 90° peel strength between the resin layer (A) and the metal foil (B) is 0.95 kN/m or greater; the average reflectance for a wavelength of 400 nm to 800 nm at the exposed surface that is obtained when the metal foil (B) is peeled and removed to expose the resin layer (A), is 80% or higher; and the decrement of the reflectances for a wavelength of 470 nm at the exposed surface obtainable before and after the metal foil laminate is subjected to a heat treatment at 260° C. for 10 minutes, is 5% or less.

Effect of the Invention

Since the metal foil laminate of the present invention is a metal foil laminate which includes a resin layer (A) containing a polyorganosiloxane and an inorganic filler, and a metal foil (B), unlike ceramic substrates and the like, the metal foil laminate is capable of coping with size increment and thickness reduction.

The metal foil laminate described in Patent Document 1 described above has a peel strength between a silicone rubber adhesive layer and a metal (copper foil) of 0.45 kN/m to 0.88 kN/m, and has a possibility of copper foil peeling at the time of etching, plating processing, or repackaging components. On the other hand, in the present invention, peeling of the metal foil (B) can be effectively prevented by adjusting the 90° peel strength between the resin layer (A) and the metal foil (B) to 0.95 kN/m or greater.

Furthermore, since the average reflectance for a wavelength of 400 nm to 800 nm is 80% or higher, and the decrement of the reflectance after a heat treatment can be suppressed, the metal foil laminate has a feature that the reflectance in the visible light region is high, and the decrease in the reflectance in a high temperature environment under thermal load is small.

Therefore, the metal foil laminate of the present invention can be suitably used as, for example, a printed wiring substrate for packaging a light emitting diode (LED) or the like.

BEST MODE(S) FOR CARRYING OUT THE INVENTION

Figure 1:
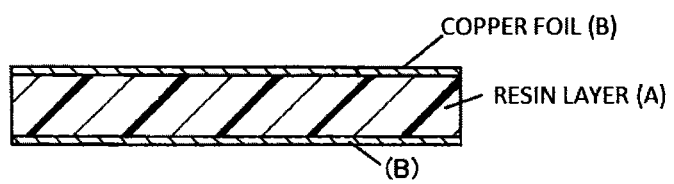
FIG. 1 is a diagram illustrating an example of the substrate for LED mounting according to the present invention, an example of a light source device using the substrate, and an example of a production process for the substrate, in which (A) illustrates an example of a both-sided copper-clad substrate as an example of the substrate, (B) illustrates an example of the substrate in a state of being etched and gold-plated, (C) illustrates an example of the substrate in a state of being packaged with a LED, and (D) illustrates an example of a light source device obtained by using the substrate.
Figure 1:
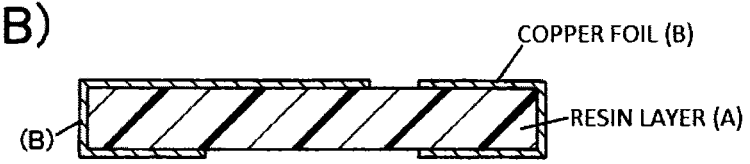
Figure 1:
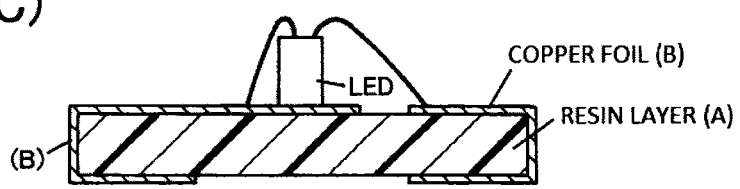
Figure 1:
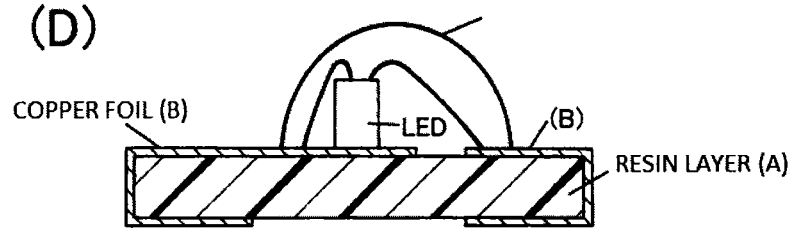

Hereinafter, exemplary embodiments of the present invention will be described, but the scope of the present invention is not intended to be limited to the following exemplary embodiments.

<Metal Foil Laminate>

The metal foil laminate according to an exemplary embodiment of the present invention (hereinafter, referred to as "present laminate") is a white-colored metal foil laminate including a resin layer (A) containing a polyorganosiloxane and an inorganic filler, and a metal foil (B) that is laminated on at least one surface of the resin layer (A).

Since it is desirable to have a resin layer (A) and a metal foil (B), as long as the functions of these resin layer (A) and metal foil (B) are not lost, the metal foil substrate may include other layers. For example, the metal foil substrate may have another resin layer, an adhesive layer to the metal foil, and the like.

(Resin layer (A))

The resin layer (A) is a layer containing a polyorganosiloxane and an inorganic filler.

[Polyorganosiloxane]

The polyorganosiloxane that is used in the resin layer (A) is a substance having a siloxane structure represented by the following formula (1), and examples thereof include polyorganosiloxanes that are capable of causing a crosslinking reaction. Particularly, polyorganosiloxanes that can be crosslinked by radiation are preferred. Among them, a polyorganosiloxane having a carbon-carbon unsaturated bond (particularly, a vinyl group), a silicon-hydrogen bond, and an oxetanyl group in the molecule is preferred.

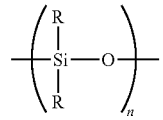

[Chemical Formula 1]

(Here, "n" represents an integer of 2 or greater)

Here, in the formula (1), "R" represents an alkyl group such as a methyl group or an ethyl group, a hydrocarbon group such as a vinyl group or a phenyl group, or a halogen-substituted hydrocarbon group such as a fluoroalkyl group. Specifically, polydimethylsiloxanes in which "R's" in the formula (1) are all methyl groups, or various polyorganosiloxanes in which a portion of the methyl groups of polydimethylsiloxane have been substituted by one kind or plural kinds of the aforementioned hydrocarbon groups or the aforementioned halogen-substituted hydrocarbon groups, may be used.

Regarding the polyorganosiloxane used in the present laminate, those polydimethylsiloxanes and various polyalkylsiloxanes may be used singly or as mixtures of two or more kinds.

Furthermore, it is preferable to incorporate silica in an amount of 5% to 30% by weight, and more preferably in an amount of 10% to 20% by weight, relative to the amount of the polyorganosiloxane. When a polyorganosiloxane containing silica in this range is used, mechanical properties as well as the adhesiveness to copper foil may be further enhanced.

[Inorganic filler]

Examples of the inorganic filler that is used in the resin layer (A) include talc, mica, isinglass, glass flakes, boron nitride (BN), calcium carbonate, aluminum hydroxide, silica, titanates (potassium titanate and the like), barium sulfate, alumina, kaolin, clay, titanium oxide, zinc oxide, zinc sulfide, lead titanate, zirconium oxide, antimony oxide, and magnesium oxide. These may be added singly, or two or more kinds thereof may be added in combination.

Regarding the inorganic filler, in order to enhance the dispersibility thereof into the layer formed of a polyorganosiloxane, inorganic fillers having their surfaces treated with a silicone-based compound, a polyhydric alcohol-based compound, an amine-based compound, a fatty acid, a fatty acid ester or the like, may be used. Among them, an inorganic filler treated with a silicone-based compound (a siloxane, a silane coupling agent, or the like) may be suitably used.

When the light reflecting properties are considered, it is preferable to use an inorganic filler which has a large difference in the refractive index with the polyorganosiloxane. Specifically, calcium carbonate, barium sulfate, zinc oxide, titanium oxide, a titanate or the like, which all have a refractive index of 1.6 or greater, are preferably used, and titanium oxide is particularly preferably used. Since titanium oxide has a markedly high refractive index as compared with other inorganic fillers, and the difference in the refractive index between titanium oxide and the base resin may be made large, excellent reflecting properties may be obtained with a small amount of incorporation, as compared with the case where other filler materials are used.

The titanium oxide that is incorporated into the resin layer (A) is preferably a crystalline titanium oxide such as anatase type or rutile type, and among them, rutile type titanium oxide is preferred from the viewpoint that the difference in the refractive index between titanium oxide and the base resin becomes large.

Examples of the method for producing titanium oxide include a chlorine method and a sulfuric acid method, but in view of the degree of whiteness, it is preferable to use a titanium oxide produced by a chlorine method.

Regarding the titanium oxide, a titanium oxide having its surface coating-treated with an inert inorganic oxide is preferred. When the surface of titanium oxide is coating treated with an inert inorganic oxide, the photocatalyst activity of titanium oxide may be suppressed, and deterioration of the film may be prevented. Regarding the inert inorganic oxide, it is preferable to use at least one kind selected from the group consisting of silica, alumina and zirconia. When these inert inorganic oxides are used, a decrease in the molecular weight of a thermoplastic resin or yellowing may be suppressed at the time of high temperature melting, without impairing high reflecting properties.

Regarding the titanium oxide, in order to improve the dispersibility into a resin composition, a titanium oxide having its surface treated with at least one kind of inorganic compound selected from the group consisting of siloxane compounds, silane coupling agents, and the like, or at least one kind of organic compound selected from the group consisting of polyols, polyethylene glycol and the like, is preferred. Particularly from the viewpoint of heat resistance, a titanium oxide treated with a silane coupling agent is preferred, and from the viewpoint of dispersibility, a titanium oxide treated with a siloxane compound is preferred.

The particle size of the inorganic filler is preferably from 0.05 μm to 15 μm, and the particle size is more preferably from 0.1 μm to 10 μm. When the particle size of a fine powder-like filler is 0.05 μm or greater, the dispersibility in a resin may be maintained, and a homogeneous resin layer (A) may be obtained. Also, when the particle size is 15 μm or less, the voids that are formed do not become coarse, and a high reflectance is obtained.

Above all, the particle size of the titanium oxide is preferably 0.1 μm to 1.0 μm, and more preferably 0.2 μm to 0.5 μm. When the particle size of the titanium oxide is in the range described above, dispersibility into a resin composition is good, and the interface between the titanium oxide and the resin composition is formed compactly, so that high reflecting properties may be imparted.

The content of the inorganic filler is preferably 10 parts by mass to 400 parts by mass, more preferably 20 parts by mass to 300 parts by mass, and even more preferably greater than or equal to 25 parts by mass or less than or equal to 200 parts by mass, relative to 100 parts by mass of the polyorganosiloxane. When the content is in the range described above, good reflection characteristics are obtained, and even if the thickness of the film is reduced, good reflection characteristics may be obtained.

[Additives and the Like]

In the constituent components of the resin layer (A), various additives other than other resins or inorganic fillers, for example, a thermal stabilizer, an ultraviolet absorber, a photostabilizer, a nucleating agent, a colorant, a lubricating agent, and a flame retardant may be appropriately incorporated to the extent that the properties of the resin layer are not impaired.

Meanwhile, in the case of crosslinking the resin layer (A) by radiation, it is not necessary to incorporate a crosslinking agent. However, if the resin layer contains a crosslinking agent, even in the case of performing crosslinking by radiation, the adhesive strength may be further increased. Therefore, it is conceived that it is preferable to incorporate a crosslinking agent in an amount of 5% by mass or less, that is, in the range of 0% to 5% by mass.

Examples of the crosslinking agent include peroxides (for example, benzoyl peroxide) and hydrogen organosiloxanes (catalyzed by platinum compounds).

[Thickness of Resin Layer (A)]

The thickness of the resin layer (A) is preferably 3 μm to 500 μm. The thickness is more preferably greater than or equal to 10 μm or less than or equal to 300 μm, and even more preferably greater than or equal to 20 μm or less than or equal to 100 μm. When the thickness is in such a range, the metal foil substrate can be suitably used as a substrate for LED mounting, which is used as a plane light source for the backlight for mobile telephones or the backlight for liquid crystal displays where thin type light sources are required.

(Metal Foil (B))

Examples of the metal foil (B) include metal foils formed from copper, gold, silver, aluminum, nickel, tin, and alloys thereof.

The thickness of the metal foil (B) is preferably 5 μm to 70 μm, and particularly preferably greater than or equal to 10 μm or less than or equal to 40 μm.

Regarding the metal foil (B), in order to increase the adhesion effect, it is preferable to use a metal foil in which the surface that is in contact with the film (superimposed surface) is chemically or mechanically roughened. Specific examples of a conductor foil that has been surface-roughened include a roughened copper foil that has been electrochemically treated when an electrolytic copper foil is produced.

Meanwhile, in the case of using a copper foil, when the resin layer (A) is crosslinked by radiation, the surface of the metal foil (B) on the side that is bonded with the resin layer (A), is preferably chemically treated with a silane coupling agent. When a copper foil that is chemically treated with a silane coupling agent is used, and the resin layer (A) is crosslinked by radiation, the adhesive strength between the resin layer (A) and the metal foil (B) may be markedly increased. It is conceived that the reason for this is that when the resin layer (A) is crosslinked by producing a radical by γ-ray crosslinking, the adhered surface between the silane coupling agent-treated metal foil and the resin layer may undergo a strong interaction with the silane coupling agent, and thereby strong adhesion may occur. Furthermore, it is also conceived that the resin layer (A) penetrates into the anchor layer of the metal foil (B), and the adhesiveness with the metal foil (B) may be enhanced.

Examples of the silane coupling agent include silane coupling agents that carry functional groups such as a vinyl group, a styryl group, a methacryloxy group, an acryloxy group, an amino group, an ureido group, a chloropyl group, a mercapto group, a sulfide group, and an isocyanate group. Specific examples of the silane coupling agent include vinyltrichlorosilane, vinyltrimethoxysilane, vinyltriethoxysilane, 3-glycidoxypropyltriethoxysilane, p-styryltrimethoxysilane, 3-methacryloxypropylmethyldimethoxysilane, 3-acryloxypropyltrimethoxysilane, 3-aminopropyltriethoxysilane, 3-ureidopropyltriethoxysilane, 3-chloropropyltrimethoxysilane, 3-mercaptopropylmethyldimethoxysilane, bis(triethoxysilylpropyl) tetrasulfide, 3-isocyanatopropyltriethoxysilane, and the like. There are no particular limitations, but the silane coupling agent is appropriately selected in accordance with the polyorganosiloxane, and one or more kinds of silane coupling agents may be used.

(90° Peel Strength)

One of the features of the present laminate may be that the 90° peel strength between the resin layer (A) and the metal foil (B) is 0.95 kN/m or greater. When the present laminate has a 90° peel strength in such a range, the possibility of the metal foil being peeled off from the resin layer at the time of an etching processing of partially removing the metal foil (B), at the time of gold plating processing or silver plating processing, or at the time of repackaging components, is decreased. Therefore, the present laminate can be suitably used as a printed wiring substrate for LED mounting having high adhesion reliability with the metal foil (B).

From this point of view, the 90° peel strength between the resin layer (A) and the metal foil (B) is more preferably 1.0 kN/m or greater, and above all, the 90° peel strength is particularly preferably 1.2 kN/m or greater.

In the present laminate, in order to increase the 90° peel strength between the resin layer (A) and the metal foil (B), it is particularly effective to have the surface of the metal foil (B) treated with a silane coupling agent, and to have the resin layer (A) crosslinked by radiation, particularly by γ-rays, to be cured. However, the present invention is not intended to be limited to such a method.

(Reflectance)

Another feature of the present laminate may be that at the exposed surface obtainable when the metal foil (B) is peeled and removed to expose the resin layer (A), more specifically, at the exposed surface obtainable when a portion or the entirety of the metal foil (B) is peeled and removed by etching or the like to expose the resin layer (A), the average reflectance for a wavelength of 400 nm to 800 nm is 80% or higher.

As the reflectance in the range of wavelengths of 400 nm to 800 nm, that is, in the wavelength range of the visible light, is higher, the luminance of the LED to be mounted tends to increase. Therefore, when the average reflectance is 80% or higher, the present laminate can be suitably utilized as a printed wiring substrate for mounting LED.

From this point of view, the average reflectance is more preferably 90% or higher, and above all, the average reflectance is more preferably 95% or higher.

Furthermore, as the reflectance for a wavelength of near 470 nm which corresponds to the average wavelength of blue LEDs (470 nm) is higher, the luminance tends to increase. Therefore, the reflectance for a wavelength of 470 nm is preferably 80% or higher, more preferably 90% or higher, and particularly preferably 95% or higher.

In order to increase the reflectance as such in the present laminate, an inorganic filler having a high refractive index (for example, titanium oxide) may be used in a highly transparent polyorganosiloxane resin. However, the present invention is not intended to be limited to such a method.

(Decrement of Reflectance)

Another feature of the present laminate may be that the decrement of the reflectance at the above-described exposed surface (the exposed surface at the time of measuring reflectance) for a wavelength of 470 nm obtainable before and after the metal foil laminate is subjected to a heat treatment at 260° C. for 10 minutes, is 5% or less.

When a LED-mounted substrate is produced, there are circumstances in which high thermal load is exerted, such as a thermosetting process (100° C. to 200° C., several hours) for an electroconductive adhesive or an encapsulating agent such as an epoxy or silicone resin, a soldering process (Pb-free solder reflow, peak temperature: 260° C., several minutes), and a wire bonding process. Also, in an actual use environment, development of high luminance LED is in progress, and the thermal load exerted to the substrate tends to increase. Thus, the temperature around a LED element may rise above 100° C.

Thus, the decrement of the reflectance for an average wavelength of blue LEDs (470 nm) obtainable before and after a metal foil laminate is subjected to a heat treatment at 260° C. for 10 minutes, is defined as an indicator for maintaining a high reflectance even in an environment under high thermal load without discoloring.

Therefore, when the decrement of the reflectance for a wavelength of 470 nm under the conditions described above (260° C., after 10 minutes) is 5% or less, a decrease in the reflectance during the production process can be prevented, and also, a decrease in the reflectance at the time of actual use can be suppressed. Therefore, the metal foil laminate can be suitably used in LED-mounted substrates.

From this point of view, the decrement of the reflectance is more preferably 2% or less, and particularly preferably 1% or less.

In regard to the present laminate, in order to prevent a decrease in the reflectance in an environment under high thermal load as such, it is desirable to select a polyorganosiloxane that undergoes less deterioration by heating in the temperature range described above. However, the present invention is not intended to be limited to such a method.

(Method for Producing Present Laminate)

The present laminate can be produced by preparing a resin composition in an uncured state for forming a resin layer (A), and laminating this resin composition on a metal foil (B) while simultaneously curing the resin composition. At this time, the timing for curing the resin composition may be before laminating the resin composition on the metal foil (B), or may be after laminating the resin composition; however, the timing is preferably before laminating the resin composition.

There are no particular limitations on the method for preparing a resin composition for forming the resin layer (A), and any known method can be used. For example, methods may be cited; method of separately preparing a master batch containing a polyorganosiloxane at a high concentration, mixing this with a resin to be used while adjusting the concentration, and mechanically blending the mixture by using a kneader, an extruder or the like; or a method of mixing a polyorganosiloxane, an inorganic filler and other additive materials, and mechanically blending the mixture by using a kneader, an extruder or the like.

As a method for laminating and integrating the resin layer (A) and the metal foil (B), known thermal fusion methods that do not need to involve an adhesive layer, for example, methods based on heating and pressing, more specifically, a hot pressing method, a heat lamination rolling method, an extrusion lamination method of laminating layers on an extruded resin by using a cast roll, a calender method, or methods combining these, can be suitably employed.

Furthermore, the resin layer (A) and the metal foil (B) may also be bonded and integrated by preparing a resin composition in an uncured state for forming the resin layer (A), laminating this resin composition in an uncured state on the metal foil (B), and then curing the resin composition.

As a method for curing the resin composition in an uncured state for forming the resin layer (A), it is preferable to crosslink the resin composition by means of radiation.

Since crosslinking by radiation is a method in which heat is not applied, this method is suitable for the use in the present invention. Curing by thermal crosslinking that is conventionally carried out requires, for example, primary curing by heating at 100° C. to 200° C. for several ten minutes, and subsequent secondary curing by heating at 200° C. to 300° C. for several hours. Therefore, when a metal foil laminate is produced, if the resin layer is laminated with a metal, there is a possibility that flaws may occur when the metal foil laminate is used as a printed wiring substrate for mounting LED, such as that the metal and the layer formed from a polyorganosiloxane may be detached due to the difference in the coefficient of linear expansion, adhesive strength may not be obtained, or wrinkles are generated in the metal layer. On the contrary, since crosslinking by radiation is a method in which heat is not applied, there is no possibility that such flaws may occur.

Furthermore, in the case of crosslinking by radiation, since a crosslinking reaction can be carried out by irradiating radiation, the crosslinking reaction can be initiated without using a crosslinking agent as in the case of crosslinking by heating. Therefore, color changes caused by a crosslinking agent that can be seen when crosslinking is achieved by using a crosslinking agent, can be avoided. Also, remaining of side products caused by the reaction of the crosslinking can also be prevented, and therefore, a resin layer (A) having excellent heat resistance and light resistance can be obtained.

As the radiation that is used in crosslinking by radiation, an electron beam, X-radiation, γ-radiation or the like can be utilized. These radiations are industrially widely utilized, and therefore, these are methods which can be easily utilized and exhibit high energy efficiency. Among them, γ-radiation is particularly preferable from the viewpoint that permeability into a metal foil is high, and there is almost no absorption loss.

The adhesiveness between the resin layer (A) and the metal foil (B) can be enhanced to a large extent by crosslinking the resin layer (A) laminated with a metal foil, by means of γ-radiation. Above all, as explained above, by having the surface of the metal foil (B), particularly a copper foil, chemically treated with a silane coupling agent, the adhesive strength between the resin layer (A) and the metal foil (B) can be more particularly increased.

The exposure dose of γ-radiation may vary with the type of the radiation source, but generally, the exposure dose is preferably from 10 kGy to 150 kGy. The exposure dose is more preferably from 20 kGy to 100 kGy, and particularly preferably from 30 kGy to 60 kGy.

For the selection of this exposure dose, it is preferable to take into consideration of the crosslinking density of the polyorganosiloxane, as well as the radiation resistance of the plastic film that is used as a base material.

<Substrate for Mounting LED>

The present laminate can be used as, for example, a substrate for mounting LED. Examples of the form include a both-sided substrate using the present laminate (see FIG. 1(A)), or a composite substrate in which a metal heat dissipating section such as an aluminum plate is provided on the present laminate (see FIG. 2(A)).

Since conventional white-colored substrates formed from thermosetting resins contain glass clothes, there may be a problem that voids (air bubbles) are likely to remain in the production process, or thickness reduction may be difficult. Also, in regard to ceramic substrates, thickness reduction is difficult because of the hard and brittle nature. However, when a substrate is produced by using the present laminate, further thickness reduction can be achieved, and the metal foil substrate can be suitably used as a substrate for backlight of mobile telephones for which there is a vigorous demand for thickness reduction. Furthermore, by laminating a resin layer (A), superior reflection characteristics can be also obtained.

As a method for producing a both-sided substrate for mounting LED by using the present laminate, for example, copper foils (B) are laminated respectively on the front and back surfaces of a resin layer (A) by vacuum pressing, a laminator, or a calender method, and then the resin layer (A) is cured by irradiating radiation or the like to produce a metal foil laminate. Subsequently, the copper foils (B) are subjected to etching or plating to form wiring patterns, and thereby a both-sided substrate for mounting LED can be produced (see FIG. 1(B)). However, the method for producing a both-sided substrate for mounting LED by using the present laminate is not intended to be limited to this method.

Further, a LED is packaged on the substrate thus produced, the LED is connected to the wiring patterns by bonding wires, and thus a LED-mounted substrate can be obtained (see FIG. 1(C)).

Figure 2:
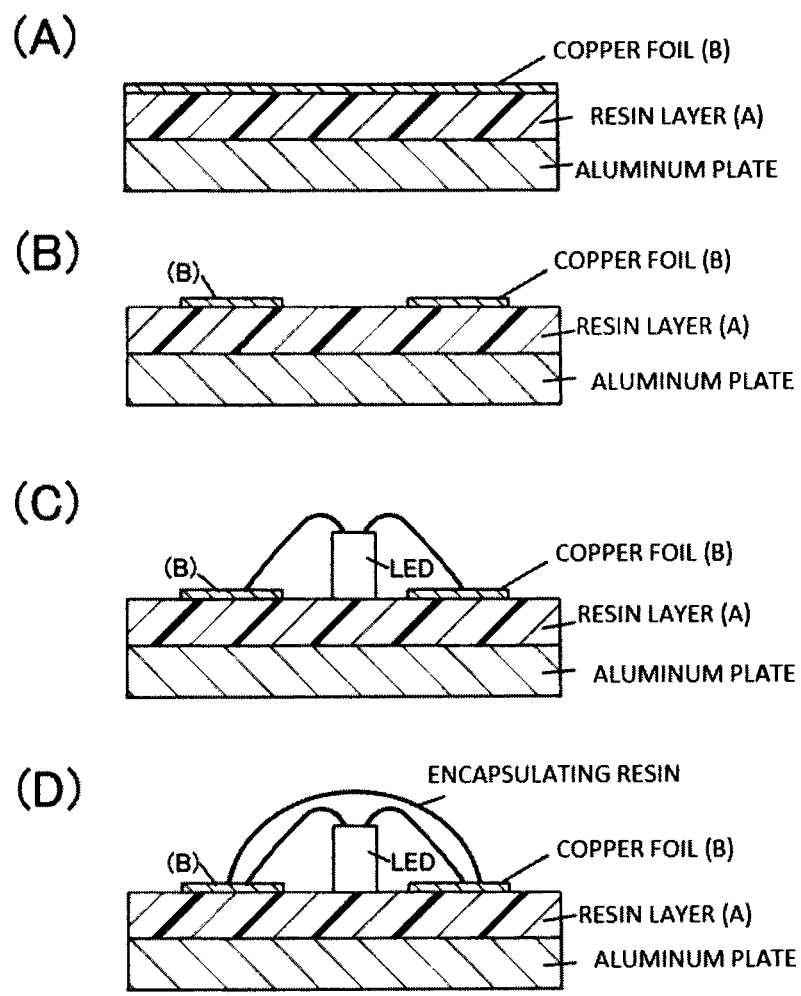
FIG. 2 is a diagram illustrating another example of the substrate for LED mounting according to the present invention, an example of a light source device using the substrate, and an example of a production process for the substrate, in which (A) illustrates an example of an aluminum composite substrate as an example of the substrate, (B) illustrates an example of the substrate in a state of being etched and gold-plated, (C) illustrates an example of the substrate in a state of being packaged with a LED, and (D) illustrates an example of a light source device obtained by using the substrate.

On the other hand, along with an improvement of luminance of LEDs, when heat dissipation properties are further required, heat dissipation properties can be enhanced by compositing the metal foil laminate with an aluminum plate (metal heat dissipating section) (see FIG. 2(A)).

An example of the configuration of a composite substrate with an aluminum plate may be a case where the present laminate is laminated over the entire surface of the aluminum plate.

In regard to the aluminum to be used, when the adhesiveness to the metal foil laminate is considered, it is preferable that the aluminum be roughened or treated with alumite.

In order to produce an aluminum composite substrate by using the present laminate, for example, the metal foil (B) of the present laminate is etched to form a wiring pattern, and a gold plating process is carried out. An aluminum plate is laminated by vacuum pressing on the surface opposite to the surface where the laminate and the wiring pattern have been formed, and thereby an aluminum composite substrate for mounting LED can be produced. However, the method for producing an aluminum composite substrate for mounting LED is not intended to be limited to this method.

A LED is mounted on the substrate produced as such, and the LED is connected to the wiring pattern by bonding wires. Thereby, a LED-mounted substrate can be obtained (see FIG. 2(C)).

<Light Source Device>

A light source device such as follows (hereinafter, referred to as "present light source device") can be configured by using a substrate for mounting LED such as described above that uses the present laminate.

An example of the light source device of the present invention may be a light source device including a substrate for mounting LED that uses the present laminate such as described above, a conductor circuit formed on the substrate, and a LED mounted on the substrate, and having a configuration in which the LED mounted on the substrate is encapsulated with a resin, and the substrate and the LED are conductively connected (see FIG. 1(D) and FIG. 2(D)).

A light source device having such a configuration has high heat resistance, has a high reflectance in the wavelength range of visible light, and has a low decrease in the reflectance in a high temperature environment under thermal load. By using the substrate for LED mounting of the present invention, a light source device in which even if the surface of the substrate packaged with a LED is exposed to a high temperature, the decrease of the reflectance is prevented, can be obtained.

Regarding the method for producing the present light source device, the light source device of the present invention can be formed by, for example, producing a substrate for mounting LED, packaging a LED thereon, connecting the LED to a conductor pattern by using bonding wires, and encapsulating the LED with an encapsulating resin (see FIG. 1(D) and FIG. 2(D)).

<Description of Terms>

In general, a "sheet" refers to a product which is thin according to the definition by JIS, and has a thickness that is generally small and flat relative to the length and the width. Generally, a "film" refers to a product which has a thickness that is very small relative to the length and the width and is thin and flat, with the maximum thickness being arbitrarily limited, and refers to a product that is usually supplied in the form of a roll (Japan Industrial Standards JIS K6900). For example, in connection to the thickness, in a narrow sense, a product having a thickness of 100 μm or greater is referred to as a sheet, while a product having a thickness of less than 100 μm is referred to as a film. However, there is no clear boundary between a sheet and a film, and it is not necessary to literally distinguish the two in the present invention. Therefore, in the present invention, even in the case of referring to a product as a "film", it is meant to include a "sheet", and even in the case of referring to a product as a "sheet", it is meant to include a "film".

In the present invention, when there is the expression "X to Y" (X and Y represent arbitrary numbers), unless particularly stated otherwise, the phrase has the meaning that the value is "greater than or equal to X and less than or equal to Y", and also includes the meaning that the value is "preferably larger than X" and "preferably less than Y".

Furthermore, in the present invention, when there is the expression "greater than or equal to X" (X represents an arbitrary number), unless particularly stated otherwise, the phrase has the meaning that the value is "preferably larger than X". When there is the expression "less than or equal to Y" (Y represents an arbitrary number), unless particularly stated otherwise, the phrase has the meaning that the value is "preferably less than Y".

EXAMPLES

Hereinafter, the present invention will be described in more detail by way of Examples and Comparative Examples, but the present invention is not intended to be limited to these. Meanwhile, the various measured values and evaluations on the film and the like described herein were determined as follows.

<Average Reflectance>

An integrating sphere was installed in a spectrophotometer ("U-4000", manufactured by Hitachi, Ltd.), and the reflectance normalized with respect to the reflectance of an alumina white plate defined as 100%, was measured over the wavelength range of 400 nm to 800 nm at an interval of 0.5 nm. The average value of the measured values thus obtained was calculated, and this value was defined as the average reflectance.

At this time, a portion of the metal foil (B) (specifically, a copper foil) of each of the metal foil laminates (samples) obtained in Examples and Comparative Examples was peeled and removed by etching to expose the resin layer (A), and the reflectance at this exposed surface was measured. The metal foil laminates were evaluated according to the following criteria.

◯: The average reflectance is 80% or higher.
x: The average reflectance is less than 80%.

<Reflectance after Heating Treatment>

Each of the metal foil laminates (samples) obtained in Examples and Comparative Examples was placed in a hot air circulating oven and was heat treated at 260° C. for 10 minutes. Also, the reflectances for a wavelength of 470 nm before and after the heat treatment were respectively measured, and the decrement (%) of the reflectance obtained after the heat treatment with respect to the reflectance obtained before the heat treatment was calculated. The metal foil laminates were evaluated according to the following criteria.

◯: The decrement of the average reflectance is 5% or less.
x: The decrement of the average reflectance is larger than 5%.

Meanwhile, the measurement of the reflectance was carried out in the same manner as in the case of the average reflectance.

<90° Peel Strength>

For each of the metal foil laminates (samples) obtained in Examples and Comparative Examples, the 90° peel strength (peel strength) of the metal foil (copper foil) was measured according to JIS C 6481.

<External Appearance of Metal Foil Laminate>

The external appearance of each of the metal foil laminates (samples) obtained in Examples and Comparative Examples was evaluated by visual inspection according to the following criteria.

◯: The metal has been peeled off, and the appearance is good without any creases.
x: The metal has been peeled off, and there are creases.

Example 1

60 parts by mass of a vinyl group-containing polysiloxane resin ("TSE2913U" manufactured by Momentive Performance Materials, Inc., containing 10% to 20% of silica) that was crosslinkable by γ-radiation, and 40 parts by mass of titanium oxide (particle size: 0.3 μm, rutile type, surface-treated with a siloxane compound) were mixed in a planetary mixer, and thus a resin composition (content of crosslinking agent: 0% by mass) was obtained. The resin composition thus obtained was extruded into a resin sheet form having a thickness of 100 μm on a PET film by using an extruder, and also a copper foil (surface-treated with a silane coupling agent) having a thickness of 18 μm was laminated on the resin sheet. Thus, a one-sided copper-clad laminate was obtained.

Subsequently, the PET film of the one-sided copper-clad laminate thus obtained was peeled off, and a copper foil (surface-treated with a silane coupling agent) having a thickness of 18 μm was laminated thereon. Thereafter, the polysiloxane resin was cured by γ-radiation at an exposure dose of 50 kGy, and thus a both-sided copper-clad laminate (sample) was obtained.

Example 2

A both-sided copper-clad film (metal foil laminate (sample)) was produced in the same manner as in Example 1, except that a vinyl group-containing polysiloxane resin ("TSE2571-5U" manufactured by Momentive Performance Materials, Inc., containing 20% to 30% of silica) that was crosslinkable by γ-radiation was used.

Example 3

A one-sided copper-clad film was produced by using the materials of Example 1, and the one-sided copper-clad film was laminated on an aluminum plate on which an adhesive primer ("XP81-A6361A,B" manufactured by Momentive Performance Materials, Inc.) had been applied in advance. Subsequently, the polysiloxane resin was cured by γ-radiation at an exposure dose of 50 kGy, and thus an aluminum substrate (metal foil laminate (sample)) was produced.

Comparative Example 1

60 parts by mass of a polysiloxane resin ("TSE2913U" manufactured by Momentive Performance Chemicals, Inc.) and 40 parts by mass of titanium oxide (particle size: 0.3 μm, rutile type, surface-treated with a siloxane compound) were mixed in a planetary mixer, and thus a resin composition was obtained. 100 parts by mass of this resin composition was mixed with 0.3 parts by mass of a thermal crosslinking agent (TC-8, manufactured by Momentive Performance Chemicals, Inc.), and the resin composition thus obtained was extruded into a resin sheet form having a thickness of 100 μm on a releasable PET film by using an extruder at a set temperature of 100° C. Also, a copper foil (surface-treated with a silane coupling agent) having a thickness of 18 μm was laminated thereon, and thus a one-sided copper-clad laminate was obtained.

Subsequently, the releasable PET film was peeled off, and a copper foil (surface-treated with a silane coupling agent) having a thickness of 18 μm was laminated thereon. Thereafter, the polysiloxane resin was thermally cured with a vacuum pressing machine for 15 minutes at 170° C. and for 4 hours at 200° C. under the conditions of 3 MPa, and thus a both-sided copper-clad laminate (sample) was obtained.

Comparative Example 2

60 parts by mass of a polysiloxane resin ("TSE2571-5U" manufactured by Momentive Performance Materials, Inc.) and 40 parts by mass of titanium oxide (particle size: 0.3 μm, surface treatment: siloxane compound) were mixed in a planetary mixer, and thus a resin composition was obtained. 100 parts by mass of this resin composition was mixed with 1.5 parts by mass of a thermal crosslinking agent (TC-12, manufactured by Momentive Performance Chemicals, Inc.), and the resin composition thus obtained was extruded into a resin sheet form having a thickness of 100 μm on a releasable PET film by using an extruder at a set temperature of 100° C. Also, a copper foil (surface-treated with a silane coupling agent) having a thickness of 18 μm was laminated thereon, and thus a one-sided copper-clad laminate was obtained.

Subsequently, the releasable PET film was peeled off, and a copper foil (surface-treated with a silane coupling agent) having a thickness of 18 μm was laminated thereon. Thereafter, the polysiloxane resin was thermally cured by using a vacuum pressing machine for 15 minutes at 125° C. and for 4 hours at 200° C. under the conditions of 3 MPa, and thus a both-sided copper-clad laminate (sample) was obtained.

(Discussion)

In Examples described above, metal foil laminates having a 90° peel strength between the resin layer (A) and the metal foil (B) of 1.4 kN/m or greater could be obtained. When this is considered together with tests and evaluations other than the Examples of the present invention, it is conceived that if the 90° peel strength between the resin layer (A) and the metal foil (B) is 0.95 kN/m or greater, at the time of etching processing of partially removing the metal foil, at the time of gold plating processing or silver plating processing, or at the time of repackaging components, the possibility that the metal foil may be peeled off from the resin layer is reduced, so that the metal foil laminate can be suitably used as a printed wiring substrate for LED mounting having high adhesion reliability with metal foils.

Furthermore, in Examples described above, metal foil laminates having an average reflectance of 98% for a wavelength of 400 nm to 800 nm could be obtained. When this is considered together with tests and evaluations other than the Examples of the present invention, it is conceived that if the average reflectance is 80% or higher, when the metal foil laminate is used as a printed wiring substrate for mounting LED, the luminance of the LED to be mounted can be sufficiently increased.

Moreover, in regard to the decrement of the reflectance after a heat treatment for 10 minutes at 260° C., the decrement in the Examples described above was 0%; however, when tests and evaluations other than the Examples of the present invention are considered, if the decrement of the reflectance is 5% or less, when the metal foil laminate is used as a printed wiring substrate for mounting LED, the metal foil laminate can maintain a high reflectance even in an environment under high thermal load, without discoloration.

The invention claimed is:
1. A metal foil laminate, comprising:
(A) a resin layer comprising a polyorganosiloxane and an inorganic filler; and
(B) a metal foil laminated on at least one surface of the resin layer (A),

TABLE 1

| | | Example 1 | Example 2 | Example 3 | Comparative Example 1 | Comparative Example 2 |
|---|---|---|---|---|---|---|
| Silicone resin | | 60 TSE2913U | 60 TSE2571-5U | 60 TSE2913U | 60 TSE2913U | 60 TSE2571-5U |
| Vulcanizing agent | | | | | 0.3 TC-8 | 1.5 TC-12 |
| Inorganic filler | Titanium oxide | 40 | 40 | 40 | 40 | 40 |
| Thickness of resin layer (A) (μm) | | 100 | 100 | 100 | 100 | 100 |
| Reflectance (%) (400 nm to 800 nm) | | 98 ○ | 98 ○ | 98 ○ | 97 ○ | 97 ○ |
| Reflectance after heating (%) (470 nm) | Before heat treatment | 102 | 102 | 102 | 101 | 101 |
| | After 10 minutes at 260° C. | 102 ○ | 102 ○ | 102 ○ | 101 ○ | 101 ○ |
| 90° peel strength (kN/m) | | 2.16 | 1.44 | 1.48 | 0.76 | 0.29 |
| External appearance of copper-clad plate | | Good ○ | Good ○ | Good ○ | Creased X | Creased X | wherein:
a 90° peel strength between the resin layer (A) and the metal foil (B) is 0.95 kN/m or greater;
an average reflectance for a wavelength of 400 nm to 800 nm at an exposed surface obtained by peeling and removing the metal foil (B) and thereby exposing the resin layer (A), is 80% or higher; and
a decrement of reflectances for a wavelength of 470 nm at exposed surfaces, obtained before and after the metal foil laminate is heat treated at 260° C. for 10 minutes, is 5% or less.

2. The metal foil laminate according to claim 1, wherein the resin layer (A) is a layer cured by radiation.

3. The metal foil laminate according to claim 2, wherein in the metal foil (B), a surface on the side that is laminated on the resin layer (A) is treated with a silane coupling agent.

4. The metal foil laminate according to claim 2, wherein the resin layer (A) further comprises a crosslinking agent in an amount of 0% to 5% by mass relative to a total amount of components of the resin layer (A).

5. The metal foil laminate according to claim 2, wherein the resin layer (A) further comprises titanium oxide as an inorganic filler.

6. The metal foil laminate according to claim 2, wherein the resin layer (A) has a thickness of from 3 μm to 500 μm.

7. A substrate for mounting LED, the substrate comprising the metal foil laminate according to claim 2.

8. A light source device, comprising:
the substrate for mounting LED according to claim 7;
a conductor circuit formed on the substrate; and
a LED mounted on the substrate,
wherein the light source device is encapsulated with a resin, and the substrate and the LED are conductively connected.

9. The metal foil laminate according to claim 1, wherein in the metal foil (B), a surface on the side that is laminated on the resin layer (A) is treated with a silane coupling agent.

10. The metal foil laminate according to claim 1, wherein the resin layer (A) further comprises a crosslinking agent in an amount of 0% to 5% by mass relative to a total amount of components of the resin layer (A).

11. The metal foil laminate according to claim 1, wherein the resin layer (A) further comprises titanium oxide as an inorganic filler.

12. The metal foil laminate according to claim 1, wherein the resin layer (A) has a thickness of from 3 μm to 500 μm.

13. A substrate for mounting LED, the substrate comprising the metal foil laminate according to claim 1.

14. A light source device, comprising:
the substrate for mounting LED according to claim 13;
a conductor circuit formed on the substrate; and
a LED mounted on the substrate,
wherein the light source device is encapsulated with a resin, and the substrate and the LED are conductively connected.

* * * * *